United States Patent
Wang et al.

(10) Patent No.: US 8,729,936 B2
(45) Date of Patent: May 20, 2014

(54) POWER SWITCH MODULE, VOLTAGE GENERATING CIRCUIT AND POWER CONTROL METHOD FOR ELECTRONIC DEVICE

(71) Applicant: Wistron Corporation, New Taipei (TW)

(72) Inventors: Yung-Feng Wang, New Taipei (TW); Meng-Jeong Pan, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 13/673,261

(22) Filed: Nov. 9, 2012

(65) Prior Publication Data
US 2013/0250633 A1     Sep. 26, 2013

(30) Foreign Application Priority Data
Mar. 20, 2012   (TW) .............................. 101109543 A

(51) Int. Cl.
*H03L 7/00* (2006.01)
*H03L 5/00* (2006.01)

(52) U.S. Cl.
CPC ... *H03L 7/00* (2013.01); *H03L 5/00* (2013.01)
USPC ......................................... 327/143; 327/142

(58) Field of Classification Search
CPC .................................... H03L 7/00; H03L 5/00
USPC ................................................. 327/142, 143
See application file for complete search history.

(56) References Cited

U.S. PATENT DOCUMENTS

| | | | | |
|---|---|---|---|---|
| 4,945,300 | A * | 7/1990 | Sato et al. | 323/318 |
| 5,365,122 | A * | 11/1994 | Rackley | 327/306 |
| 5,519,346 | A * | 5/1996 | Haddad et al. | 327/143 |
| 5,847,587 | A * | 12/1998 | Chen et al. | 327/143 |
| 6,903,583 | B1 * | 6/2005 | Habib et al. | 327/143 |
| 7,026,849 | B2 * | 4/2006 | Ichikawa | 327/142 |
| 7,673,194 | B1 * | 3/2010 | Sun et al. | 714/718 |
| 8,004,333 | B2 * | 8/2011 | Lin et al. | 327/198 |
| 2008/0036510 | A1 * | 2/2008 | Kim | 327/143 |
| 2013/0106473 | A1 * | 5/2013 | Newman et al. | 327/142 |
| 2013/0187687 | A1 * | 7/2013 | Newman et al. | 327/143 |
| 2013/0307595 | A1 * | 11/2013 | Koo et al. | 327/142 |

* cited by examiner

*Primary Examiner* — Ryan Jager
(74) *Attorney, Agent, or Firm* — McClure, Qualey & Rodack, LLP

(57) ABSTRACT

A power switch module for an electronic device includes a flip-flop circuit, a first current path for coupling a voltage source to the flip-flop circuit, and a second current path for coupling the voltage source to the flip-flop circuit. In response to a user power-on event, an output of the flip-flop circuit is at a first logic state for normally powering on the electronic device. In response to a user power-off event, the output of the flip-flop circuit is at a second logic state for normally powering off the electronic device. When the voltage source is suddenly interrupted, the output of the flip-flop circuit is kept at the first logic state but the electronic device is abnormally powered off. After the voltage source is resumed, the output of the flip-flop circuit kept at the first logic state reboots the abnormally powered-off electronic device.

19 Claims, 4 Drawing Sheets

POWER SWITCH MODULE, VOLTAGE GENERATING CIRCUIT AND POWER CONTROL METHOD FOR ELECTRONIC DEVICE

This application claims the benefit of Taiwan application Serial No. 101109543, filed Mar. 20, 2012, the subject matter of which is incorporated herein by reference.

TECHNICAL FIELD

The disclosure relates in a power switch module, a voltage generating circuit and a power control method applied to an electronic device to restore a last state in a no-BIOS (basic input/output system) electronic device.

BACKGROUND

Circumstances of insufficient power supply or power interrupt are occasionally encountered when using a computer, leading to a forced shutdown. In current techniques, a basic input/output system (BIOS) is capable of restoring the forced-shutdown computer to a last state. That is, for example, the computer is in a normal powered on state before the power interrupt, and is forced to shut down when the power is interrupted. Under the control of the BIOS, without needing a manual power-on operation performed by a user, the computer is automatically restored to a normally powered on state after eliminating the power interrupt (i.e., after the power is resumed).

However, for no-BIOS electronic device, e.g., a system-on chip (SoC) electronic device, there is a need for a lower-cost solution for restoring a last state.

SUMMARY OF THE DISCLOSURE

The disclosure is directed to a power switch module, a voltage generating circuit and a power control method for a no-BIOS electronic device to restore a last state through an integrated logic circuit.

According to an exemplary embodiment of the disclosure, a power switch module for an electronic device is provided. The power switch includes: a flip-flop circuit; a first current path, for coupling a voltage source to the flip-flop circuit; and a second current path, for coupling the voltage source to the flip-flop circuit. In response to a user power-on event, an output of the flip-flop circuit is at a first logic state for normally powering on the electronic state. In response to a user power-off event, the output of the flip-flop circuit is at a second logic state for normally powering off the electronic device. When the voltage source is suddenly interrupted, the output of the flip-flop circuit is kept at the first logic state but the electronic device is abnormally powered off. When the voltage source is resumed, the output of the flip-flop circuit kept at the first logic state reboots the abnormally powered off electronic device.

According to another exemplary embodiment of the disclosure, a voltage generating circuit for an electronic device is provided. The voltage generating circuit includes: a power supply, for converting an alternating-current (AC) voltage source to a direct-current (DC) voltage source; a voltage modulating module, coupled to the power supply; and a power switch module, coupled to the voltage modulating module, for controlling the voltage modulating module. In response to a user power-on event, an output signal of the power switch module is at a first logic state for normally powering on the electronic device. In response to a user power-off event, the output signal of the power switch module is at a second logic state for normally powering off the electronic device. When a voltage source input to the power switch module is suddenly interrupted, the output signal of the power switch module is kept at the first logic state but the electronic device is abnormally powered off. When the voltage source input to the power switch module is resumed, the output signal of the power switch module kept at the first logic state reboots the abnormally powered off electronic device.

According to yet another exemplary embodiment of the disclosure, a power control method for an electronic device is provided. In response to a user power-on event, an output signal of a power switch module is controlled to be at a first logic state for coupling an operating voltage source to at least one internal element of the electronic device. In response to a user power-off event, the output signal of the power switch module is controlled to be a second logic state for disconnecting the operating voltage source from the at least one internal element of the electronic device. When the operating voltage source is suddenly interrupted, the output signal of the power switch module is controlled to be at the first logic state but the operating voltage source is disconnected from the at least one internal element of the electronic device. When the operating voltage source is resumed, the output signal of the power switch module kept at the first logic state controls the operating voltage source to be coupled to the at least one internal element of the electronic device, to reboot the electronic device.

The above and other contents of the disclosure will become better understood with regard to the following detailed description of the preferred but non-limiting embodiments. The following description is made with reference to the accompanying drawings.

Figure 1:
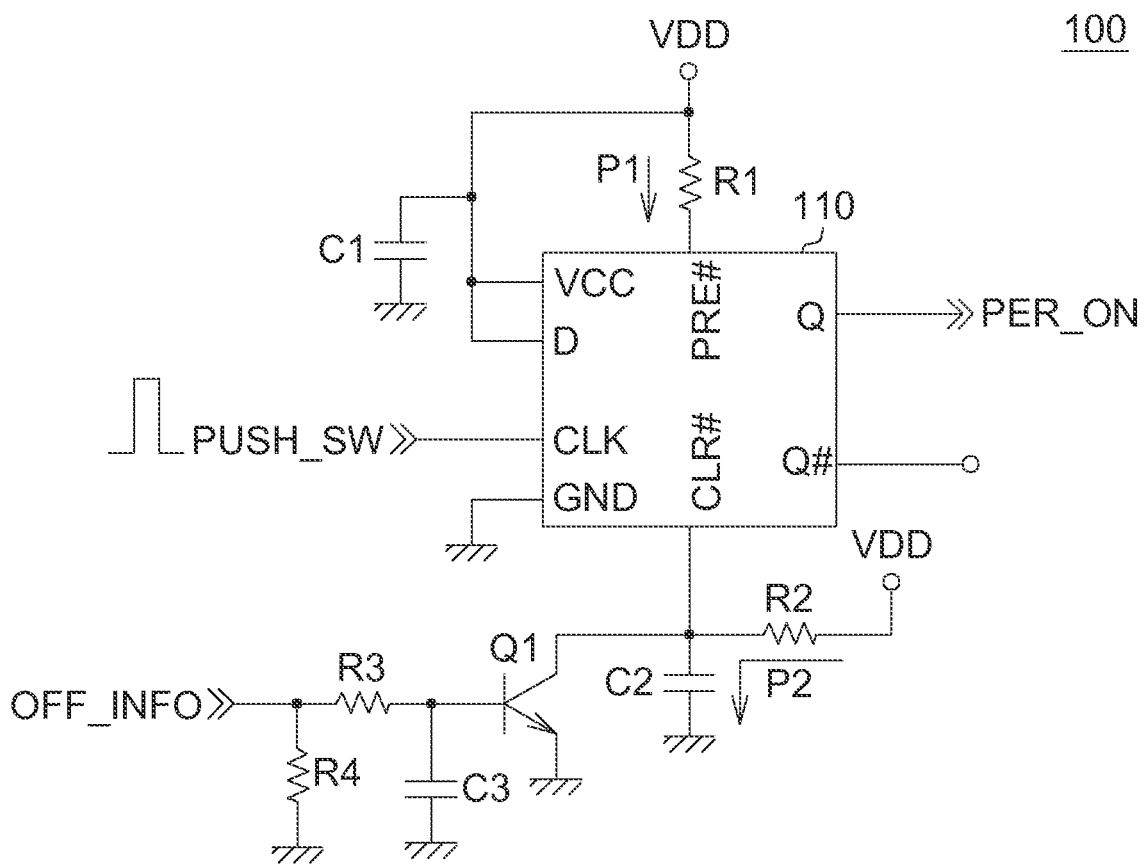
FIG. 1 is a schematic diagram of a power switch module according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF THE DISCLOSURE

Several embodiment of the disclosure shall be given below for explaining details for restoring a last state by a power switch module.

FIG. 1 shows a schematic diagram of a power switch module 100 according to an embodiment of the disclosure. As shown in FIG. 1, the power switch module 100 includes a flip-flop circuit 110, resistors R1 to R4, capacitors C1 to C3, and a switch Q1. In FIG. 1, for example, the flip-flop circuit 110 is a D flip-flop.

An operating voltage source VDD is applied to a pin PRE# of the flip-flop circuit 110 via the resistor R1. That is, the
} resistor R1 forms a first current path P1 for coupling the operating voltage source VDD to the flip-flop circuit 110.

The operating voltage source VDD is also applied to a pin CLR# of the flip-flop circuit 110 via the resistor R2 and the capacitor C2. That is, the resistor R2 and the capacitor C2 form a second current path P2 for coupling the operating voltage source VDD to the flip-flop circuit 110. By comparing the two current paths P1 and P2, due to the capacitor C2, it is known that an RC delay of the first current path P1 is smaller than an RC delay of the second current path P2.

Further, the operating voltage source VDD is also applied to a pin VCC and a pin D of the flip-flop circuit 110. That is to say, under a normal power condition of the operating voltage source VDD, the pins VCC and D of the flip-flop circuit 110 are constantly maintained at a high potential. The capacitor C1 is for stabilizing voltages at the pins VCC and D.

A signal PUSH_SW, associated with a user power-on operation, is inputted into a pin CLK of the flip-flop circuit 110. For example, in response to a user event of pressing a power-on switch (not shown) of the electronic device 100, a pulse in the signal PUSH_SW is generated.

The transistor (switch) Q1 is controlled by a signal OFF_INFO. For example, when the signal OFF_INFO is at logic high, the transistor Q1 is conducted to pull down the clear signal CLR#. Conversely, when the signal OFF_INFO is logic low, the transistor Q1 is cut off.

The resistor R3 and the capacitor C3 form a slow start path. The resistor R3 serves as a current limiting resistor for preventing a large current from passing through the transistor Q1. The resistor R4 ensures that the signal OFF_INFO is at logic low under a normal condition. Details of the signal OFF_INFO shall be described shortly. The resistor R3, the capacitor C3 and the resistor R4 form a discharging path.

Table-1 shows a truth table of the flip-flop circuit 110:

TABLE 1

| Input | | | | Output | |
|---|---|---|---|---|---|
| PRE# | CLR# | CLK | D | Q | Q# |
| L | H | X | X | H | L |
| H | L | X | X | L | H |
| L | L | X | X | H* | H* |
| H | H | ↑ | H | H | L |
| H | H | ↑ | L | L | H |
| H | H | L | X | $Q_0$ | $Q\#_0$ |

In the above truth table 1, "H*" represents an unstable state.

As the electronic device is first powered on (i.e., to be referred to as an initial conducted state), the operating voltage source VDD is just applied to the first current path P1 and the second current path P2. As previously stated, the RC delay of the first current path P1 is smaller and the RC delay of the second current path P2 is greater. So the preset signal PRE# is already pulled up to logic high (H) while the clear signal CLR# remains at logic low in the initial conducted state. Therefore, as observed from truth table shown in Table-1, under the initial conducted state, the output signal Q of the flip-flop circuit 110 is logic low, i.e., the signal PWR_ON is also logic low.

After a predetermined period subsequent to powering on the electronic device, the preset signal PRE# and the clear signal CLR# are both at logic high. It is known from the truth table in Table-1 that, the output signal Q of the flip-flop circuit 110 is at logic high, i.e., the signal PWR_ON is also at logic high, indicating that the electronic device is under a normal powered-on state.

In response to a user power-off event, e.g., a user powers off the electronic device through an operating system of the electronic device, the signal OFF_INFO is at logic high and the switch Q1 is conducted for pulling down the clear signal CLR# to logic low, whereas the preset signal PRE# at this point remains at logic high. It is known from the truth table in Table-1 that, the output signal Q of the flip-flop circuit 110 is at logic low, i.e., the signal PWR_ON is also at logic low, thus normally powering off the electronic device.

However, in the occurrence of the operating voltage source VDD being suddenly interrupted, the operating system does not control the signal OFF_INFO to be at logic high (i.e., the signal OFF_INFO is kept at logic low) since a user command for normally powering off is not received. Therefore, the transistor Q1 remains cut off, such that the clear signal CLR# is kept at logic high instead of being pulled down to logic low. Thus, the output signal Q of the flip-flop circuit 110 is kept at logic high, i.e., the signal PWR_ON is also at logic high.

When power supply is resumed, the output signal Q of the flip-flop circuit 110 and the signal PWR_ON are both at logic high to reboot the electronic device, with associated details to be described shortly. That is to say, when power supply is restored, without manually pressing down the power-on switch by the user, the electronic device automatically reboots to restore a state (a normal operation) before the power interrupt.

Figure 2A:
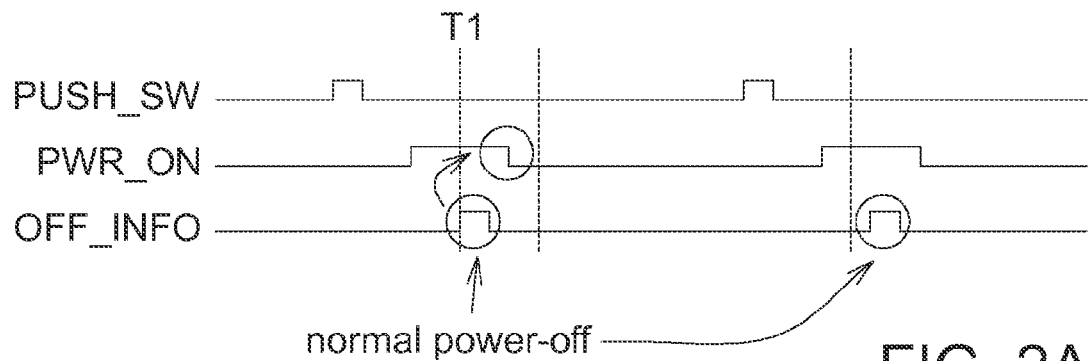
FIGS. 2A and 2B are signal timing diagrams of FIG. 1 according to the embodiment of the disclosure.
Figure 2B:
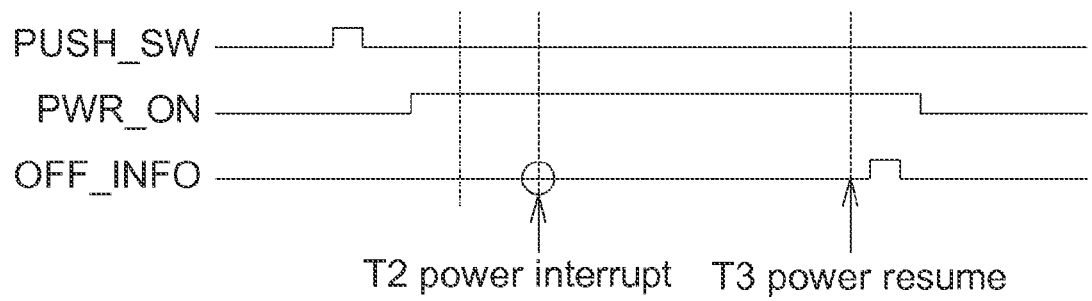

FIGS. 2A and 2B show signal timing diagrams according to the embodiment of the disclosure in FIG. 1. FIG. 2A shows a timing diagram of signals when the electronic device is normally powered off. Assume that a user issues a "normal power-off command" at a time point T1. As previously described, since the electronic device is normally powered off, the signal PWR_ON is pulled down to logic low.

In FIG. 2B, assume that a power interrupt occurs at a time point T2. As previously described, the signal PWR_ON is kept at logic high. Assume that power supply is resumed at a time point T3. Since the signal PWR_ON is at logic high, the electronic device automatically reboots without requiring the user to again press the power-on switch.

Figure 3:
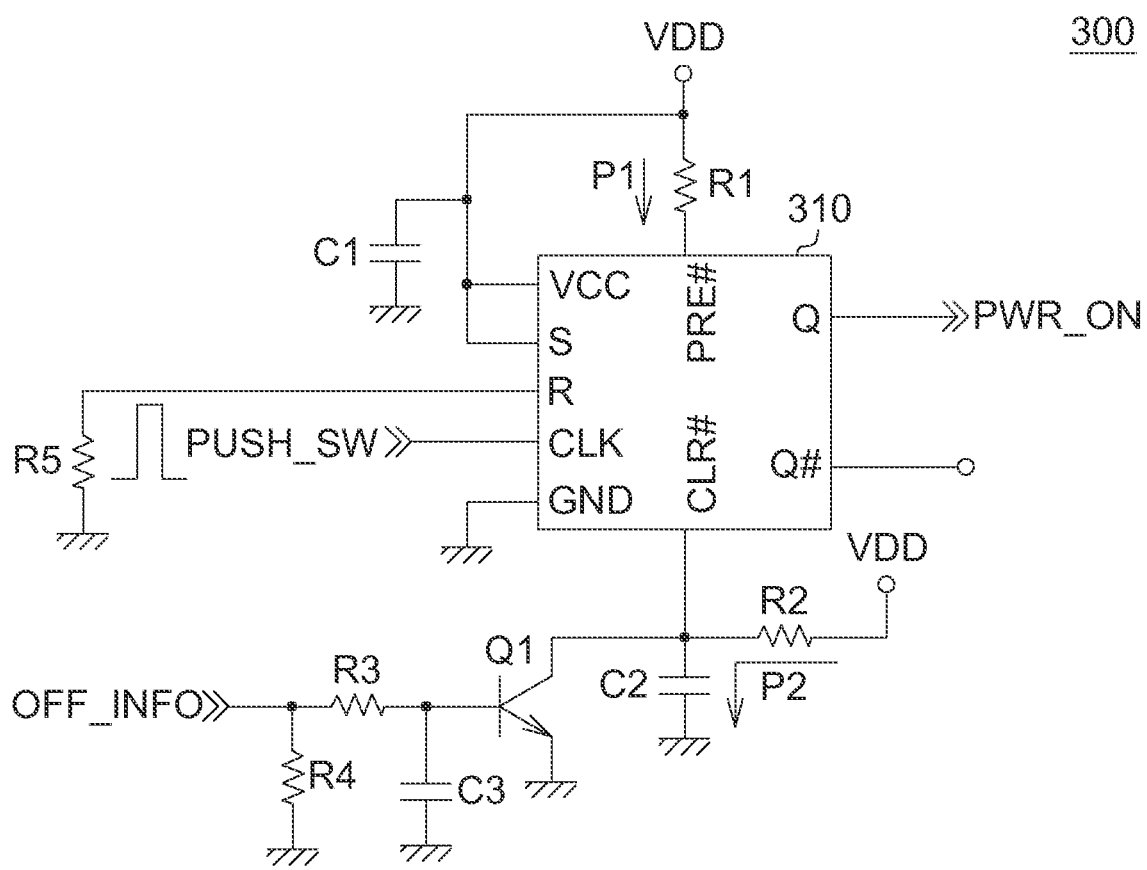
FIGS. 3 and 4 are respectively schematic diagrams of two power switch modules according to embodiments of the disclosure.
Figure 4:
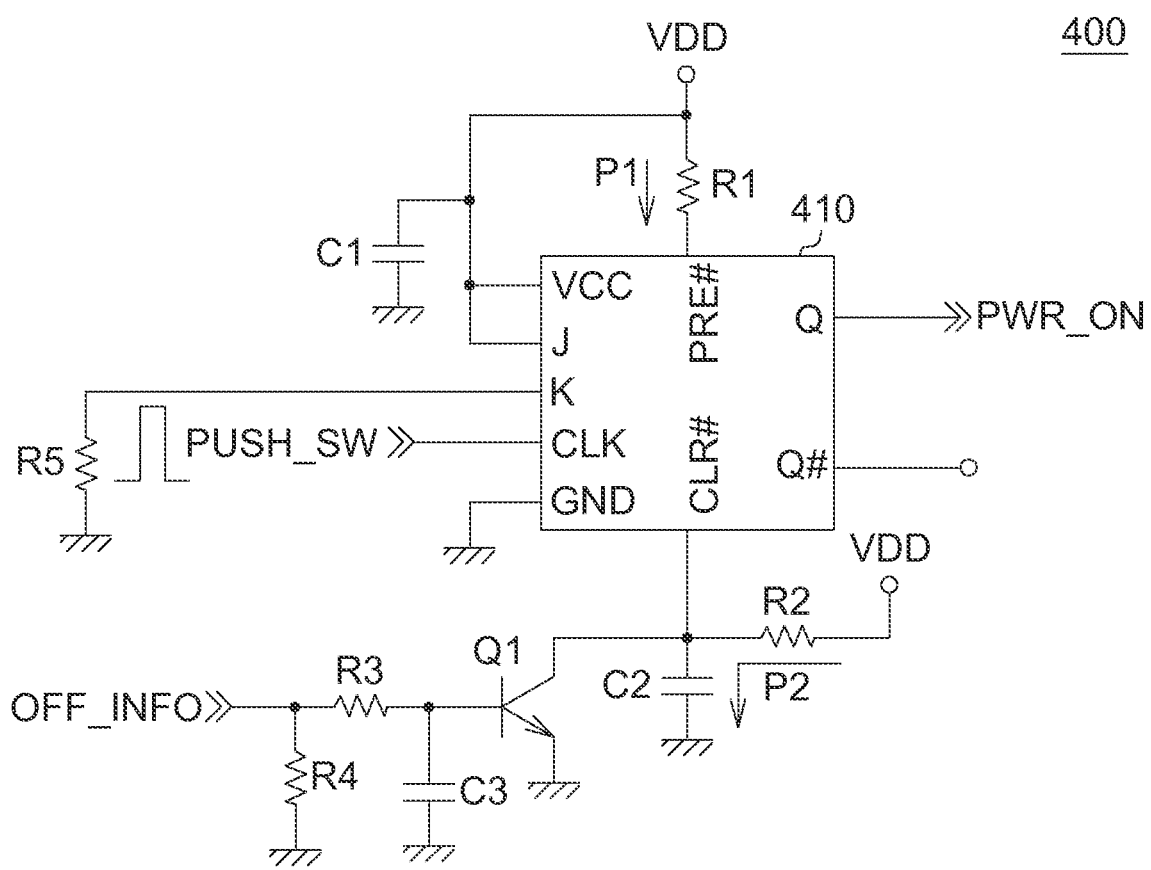

FIGS. 3 and 4 respectively show schematic diagrams of power switch modules 300 and 400 according to embodiments of the disclosure.

In principle, structures and operations of the power switch modules in FIGS. 3 and 4 are similar to those in FIG. 1. In FIG. 3, a flip-flop circuit 310 is an SR flip-flop having a pin R grounded via a resistor R4. In FIG. 4, a flip-flop circuit 410 is a JK flip-flop having a pin K grounded via a resistor R5.

Table-2 shows a truth table of the flip-flop circuit 310:

TABLE 2

| Input | | | | | Output | |
|---|---|---|---|---|---|---|
| PRE# | CLR# | CLK | S | R | Q | Q# |
| L | H | X | X | X | H | L |
| H | L | X | X | X | L | H |
| H | H | L | X | X | $Q_0$ | $Q\#_0$ |
| H | H | ↑ | L | L | $Q_0$ | $Q\#_0$ |
| H | H | ↑ | L | H | L | H |
| H | H | ↑ | H | L | H | L |
| H | H | ↑ | H | H | ? | ? |

In the above truth table in Table-2, "?" represents undefined and is defined according to actual circuit logic designs.

Similarly, under the initial conducted state, the preset signal PRE# is at logic high (H) and the clear signal CLR# is at logic low (L). Therefore, as seen from the second situation in the above truth table in Table-2, under the initial conducted state, the output signal Q of the flip-flop circuit 310 is at logic low, i.e., the signal PWR_ON is also at logic low.

After a predetermined period subsequent to powering on the electronic device, the preset signal PRE# and the clear signal CLR# are both at logic high. It is seen from the sixth situation in the above truth table in Table-2 that, the output signal Q of the flip-flop circuit 310 is at logic high, i.e., the signal PWR_ON is also at logic high, indicating that the electronic device is under a normal powered on state.

In response to a user power-off event, e.g., a user powers off the electronic device through an operating system of the electronic device, the signal OFF_INFO is at logic high and thus the switch Q1 is conducted to pull down the clear signal CLR# to logic low, whereas the preset signal PRE# at this point remains at logic high. It is known from the second situation in the above truth table in Table-2 that, the output signal Q of the flip-flop circuit 310 is at logic low, i.e., the signal PWR_ON is also at logic low, thus normally powering off the electronic device.

Under normal operations, in the occurrence of the operating voltage source VDD suddenly being interrupted, the operating system does not control the signal OFF_INFO to be logic high (i.e., the signal OFF_INFO is kept at logic low) since a normal power-off operation is not performed. Therefore, the clear signal CLR# is kept at logic high instead of being pulled down to logic low, and the output signal Q of the flip-flop circuit 310 is kept at logic high, i.e., the signal PWR_ON is also at logic high.

When power supply is resumed, the output signal Q of the flip-flop circuit 310 and the signal PWR_ON are both at logic high to reboot the electronic device. That is to say, when power supply is resumed, without manually pressing down the power-on switch by the user, the electronic device automatically reboots to restore a state (a normal operation) before the power interrupt.

Table-3 shows a truth table of the flip-flop circuit 410:

TABLE 3

| Input | | | | | Output | |
|---|---|---|---|---|---|---|
| PRE# | CLR# | CLK | J | K | Q | Q# |
| L | H | X | X | X | H | L |
| H | L | X | X | X | L | H |
| H | H | L | X | X | $Q_0$ | $Q\#_0$ |
| H | H | ↑ | L | L | $Q_0$ | $Q\#_0$ |
| H | H | ↑ | L | H | L | H |
| H | H | ↑ | H | L | H | L |
| H | H | ↑ | H | H | $Q\#_0$ | $Q_0$ |

Similarly, under the initial conducted state, the preset signal PRE# is at logic high (H) and the clear signal CLR# is at logic low (L). Therefore, as seen from the second situation in the above truth table in Table-3, under the initial conducted state, the output signal Q of the flip-flop circuit 410 is at logic low, i.e., the signal PWR_ON is also at logic low.

After a predetermined period subsequent to powering on the electronic device, the preset signal PRE# and the clear signal CLR# are both at logic high. It is seen from the sixth situation in the above truth table in Table-3 that, the output signal Q of the flip-flop circuit 410 is at logic high, i.e., the signal PWR_ON is also at logic high, indicating that the electronic device is under a normal powered on state.

In response to a user power-off event, e.g., a user powers off the electronic device through an operating system of the electronic device, the signal OFF_INFO is at logic high and thus the switch Q1 is conducted to pull down the clear signal CLR# to logic low, whereas the preset signal PRE# at this point remains at logic high. It is known from the second situation in the above truth table in Table-3 that, the output signal Q of the flip-flop circuit 410 is at logic low, i.e., the signal PWR_ON is also at logic low, thus normally powering off the electronic device.

Under normal operations, in the occurrence of the operating voltage source VDD suddenly being interrupted, the operating system does not control the signal OFF_INFO to be logic high (i.e., the signal OFF_INFO is kept at logic low) since a normal power-off operation is not performed. Therefore, the clear signal CLR# is kept at logic high instead of being pulled down to logic low, and the output signal Q of the flip-flop circuit 410 is kept at logic high, i.e., the signal PWR_ON is also at logic high.

When power supply is resumed, the output signal Q of the flip-flop circuit 410 and the signal PWR_ON are both at logic high to reboot the electronic device. That is to say, when power supply is resumed, without manually pressing down the power-on switch by the user, the electronic device automatically reboots to restore a state (a normal operation) before the power interrupt.

Figure 5:
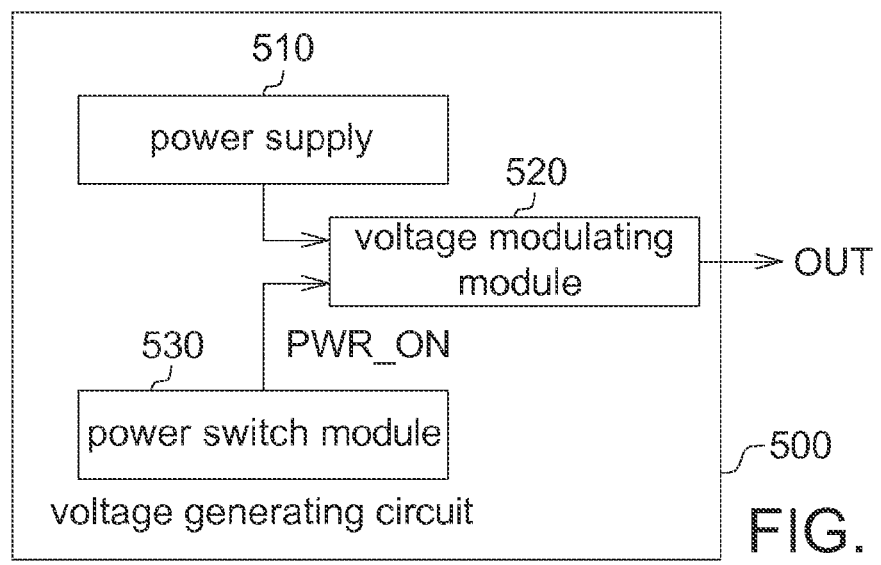
FIG. 5 is a schematic diagram of a voltage generating circuit according to another embodiment of the disclosure.

FIG. 5 shows a schematic diagram of a voltage generating circuit according to another embodiment of the disclosure. A voltage generating circuit 500 includes: a power supply 510, for converting an AC voltage source to a DC voltage source; a voltage modulating module 520, coupled to the power supply 510; and a power switch module 530, coupled to the voltage modulating module 520, for controlling the voltage modulating module 520. For example, the power switch module 530 may have a structure as that shown in FIG. 1, 3, or 4.

For example, the power supply 510 converts city electricity to a 19V DC voltage, and the voltage modulating module 520 modulates the 19V DC voltage to another DC voltage (for example, 5V, 3.3V) suitable for internal electronic elements (e.g., a CPU) of the electronic device.

The output signal PWR_ON outputted by the power switch module 530 controls operations of the voltage modulating module 520. For example, when the signal PWR_ON is at logic high, the voltage modulating module 520 is under normal operations. Conversely, when the signal PWR_ON is at logic low, the voltage modulating module 520 is turned off.

Accordingly, in embodiment of the disclosure, when power is resumed after an occurrence of a power interrupt, the voltage modulating module 520 is automatically activated to normally power internal electronic elements of the electronic device because the signal PWR_ON is at logic high. Thus, the electronic device is automatically rebooted without requiring the user manually powering on the electronic device.

Therefore, it is demonstrated by embodiments of the disclosure that, a last state may be restored through a simple power switch module. By implementing the embodiments to a no-BIOS electronic device, a last state can be restored without needing additional and costly complex programmable logic device (CPLD), thereby reducing costs as well as increasing product competitiveness.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A power switch module for an electronic device, comprising:
   a flip-flop circuit;
   a first current path, for coupling a voltage source to the flip-flop circuit; and
   a second current path, for coupling the voltage source to the flip-flop circuit;

wherein, in response to a user power-on event, an output of the flip-flop circuit is at a first logic state for normally powering on the electronic device;

in response to a user power-off event, the output of the flip-flop circuit is at a second logic state for normally powering off the electronic state;

when the voltage source is suddenly interrupted, the output of the flip-flop circuit is kept at the first logic state but the electronic device is abnormally powered off; and when the voltage source is resumed, the output of the flip-flop circuit kept at the first logic state reboots the electronic device.

2. The power switch module according to claim 1, wherein the flip-flop circuit comprises any one or any combination of a D flip-flop, an SR flip-flop and a JK flip-flop.

3. The power switch module according to claim 1, wherein a delay parameter of the first current path is smaller than a delay parameter of the second current path.

4. The power switch module according to claim 3, wherein the first current path comprises a first resistive element, and the second current path comprises a second resistive element and a first capacitive element.

5. The power switch module according to claim 3, wherein when the voltage source is initially coupled to the electronic device, a preset signal of the flip-flop circuit coupled to the first current path is at the first logic state, and a clear signal of the flip-flop circuit coupled to the second path is at the second logic state, such that the output of the flip-flop circuit is at the second logic state.

6. The power switch module according to claim 5, wherein after a predetermined period subsequent to coupling the voltage source to the electronic device, in response to the user power-off event, the preset signal and the clear signal are both at the first logic state to transit the output of the flip-flop circuit to the first logic state for normally powering on the electronic device.

7. The power switch module according to claim 5, wherein, in response to the user power-off event, a power-off signal at the first logic state transits the clear signal to the second logic state but the preset signal remains at the first logic state, such that the output of the flip-flop circuit is the second logic state for normally powering off the electronic device.

8. The power switch module according to claim 7, wherein when the voltage source is suddenly interrupted, the power-off signal at the second logic state keeps the clear signal at the first logic state but the preset signal transits from the first logic state to the second logic state, such that the output of the flip-flop circuit is at the first logic state for abnormally powering off the electronic device.

9. A voltage generating circuit for an electronic device, comprising:

a power supply, for converting an alternating-current (AC) voltage source to a direct-current (DC) voltage source;

a voltage modulating module, coupled to the power supply; and a power switch module, coupled to the voltage modulating module, for controlling the voltage modulating module;

wherein, in response to a user power-on event, an output signal of the power switch module is at a first logic state for normally power on the electronic device;

in response to a user power-off event, the output signal of the power switch module is at a second logic state for normally powering off the electronic device;

when a voltage source input to the power switch module is suddenly interrupted, the output signal of the power switch module is kept the first logic state but the electronic device is abnormally powered off; and when the voltage source input to the power switch module is resumed, the output signal of power switch module kept at the first logic state reboots the electronic device.

10. The voltage generating circuit accordingly to claim 9, wherein the power switch module comprises:

a flip-flop circuit;

a first current path, for coupling a voltage source to the flip-flop circuit; and a second current path, for coupling the voltage source to the flip-flop circuit.

11. The voltage generating circuit accordingly to claim 10, wherein the flip-flop circuit comprises any one or any combination of a D flip-flop, an SR flip-flop and a JK flip-flop.

12. The voltage generating circuit accordingly to claim 10, wherein a delay parameter of the first current path is smaller than a delay parameter of the second current path.

13. The voltage generating circuit accordingly to claim 12, wherein the first current path comprises a first resistive element, and the second current path comprises a second resistive element and a first capacitive element.

14. The voltage generating circuit accordingly to claim 12, wherein when the voltage source is initially coupled to the electronic device, a preset signal of the flip-flop circuit coupled to the first current path is at the first logic state, and a clear signal of the flip-flop circuit coupled to the second path is at the second logic state, such that the output of the flip-flop circuit is at the second logic state.

15. The voltage generating circuit accordingly to claim 14, after a predetermined period subsequent to coupling the voltage source to the electronic device, in response to the user power-off event, the preset signal and the clear signal are both at the first logic state to transit the output of the flip-flop circuit to the first logic state for normally powering on the electronic device.

16. The voltage generating circuit accordingly to claim 14, wherein, in response to the user power-off event, a power-off signal at the first logic state transits the clear signal to the second logic state but the preset signal remains at the first logic state, such that the output of the flip-flop circuit is the second logic state for normally powering off the electronic device.

17. The voltage generating circuit accordingly to claim 16, wherein when the voltage source is suddenly interrupted, the power-off signal at the second logic state keeps the clear signal at the first logic state but the preset signal transits from the first logic state to the second logic state, such that the output of the flip-flop circuit is at the first logic state for abnormally powering off the electronic device.

18. A power control method for an electronic device, comprising:

in response to a user power-on event, controlling an output signal of a power switch module to be at a first logic state for coupling an operating voltage source to at least one internal element of the electronic device;

in response to a user power-off event, controlling the output signal of the power switch module to be a second logic state for disconnecting the operating voltage source from the at least one internal element of the electronic device;

when the operating voltage source is suddenly interrupted, controlling the output signal of the power switch module to be at the first logic state and disconnecting the operating voltage source from the at least one internal element of the electronic device; and when the operating voltage source is resumed, the output signal of the power switch module kept at the first logic state controlling the operating voltage source to be coupled to the at least one internal element of the electronic device, to reboot the electronic device.

19. The power control method according to claim 18, wherein after the operation voltage source is suddenly interrupted and before the operation voltage source is resumed, the output of the power switch module is kept at the first logic state.

* * * * *